United States Patent
Cheng et al.

(10) Patent No.: US 12,527,048 B2
(45) Date of Patent: Jan. 13, 2026

(54) ISOLATION STRUCTURES FOR SEMICONDUCTOR DEVICES

(71) Applicant: Taiwan Semiconductor Manufacturing Company, Ltd., Hsinchu (TW)

(72) Inventors: I-I Cheng, Tainan (TW); Chen-Chieh Chiang, Kaohsiung (TW); Kun-Ei Chen, Tainan (TW); Pei-Lum Ma, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 744 days.

(21) Appl. No.: 17/675,650

(22) Filed: Feb. 18, 2022

(65) Prior Publication Data

US 2023/0135392 A1 May 4, 2023

Related U.S. Application Data

(60) Provisional application No. 63/275,689, filed on Nov. 4, 2021.

(51) Int. Cl.
*H10D 62/10* (2025.01)
*H10D 30/01* (2025.01)
(Continued)

(52) U.S. Cl.
CPC ......... *H10D 62/116* (2025.01); *H10D 30/024* (2025.01); *H10D 30/6211* (2025.01); *H10D 30/6219* (2025.01); *H10D 84/013* (2025.01); *H10D 84/0158* (2025.01); *H10D 84/038* (2025.01)

(58) Field of Classification Search
CPC ... H01L 21/823431; H01L 2924/13067; H01L 29/41791; H01L 27/1211; H01L 27/0924; H01L 27/0886; H01L 21/845; H01L 21/823821; H01L 27/088; H01L 29/0653; H01L 21/823418; H01L 29/7851; H01L 21/823456; H01L 21/823481; H01L 29/04–045; H01L 29/16–1608; H01L 29/18–185; H01L 29/22–2206; H01L 29/36–365; H01L 2029/7857–7858; H01L 29/785–7856; H01L 29/66795–66818; H10B 12/056;
(Continued)

(56) References Cited

U.S. PATENT DOCUMENTS 8,765,546 B1 * 7/2014 Hung .............. H01L 21/823431
257/190
9,093,530 B2 7/2015 Huang et al.
(Continued)

*Primary Examiner* — Matthew C Landau
(74) *Attorney, Agent, or Firm* — Sterne, Kessler, Goldstein & Fox P.L.L.C.

(57) ABSTRACT

The present disclosure describes a semiconductor device having an isolation structure with a protection layer. The semiconductor device includes a substrate, a transistor with a source/drain (S/D) structure on the substrate, and an isolation structure on the substrate and adjacent to the transistor. The isolation structure includes a dielectric structure on the substrate, a protection layer on the dielectric structure, and a gate structure on the protection layer. The protection layer is disposed between the gate structure and the S/D structure.

20 Claims, 12 Drawing Sheets

(51) Int. Cl.
*H10D 30/62* (2025.01)
*H10D 84/01* (2025.01)
*H10D 84/03* (2025.01)

(58) Field of Classification Search
CPC ...... H10B 12/36; H10D 30/62; H10D 30/024; H10D 64/511
See application file for complete search history.

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2013/0292835 A1* | 11/2013 | King | H01L 21/022 438/622 |
| 2017/0141211 A1* | 5/2017 | Xie | H01L 21/76224 |

\* cited by examiner

ISOLATION STRUCTURES FOR SEMICONDUCTOR DEVICES

CROSS-REFERENCE TO RELATED APPLICATION

This application claims the benefit of U.S. Provisional Patent Application No. 63/275,689, titled "isolation Structures for Semiconductor Devices," filed Nov. 4, 2021, the disclosure of which is incorporated by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
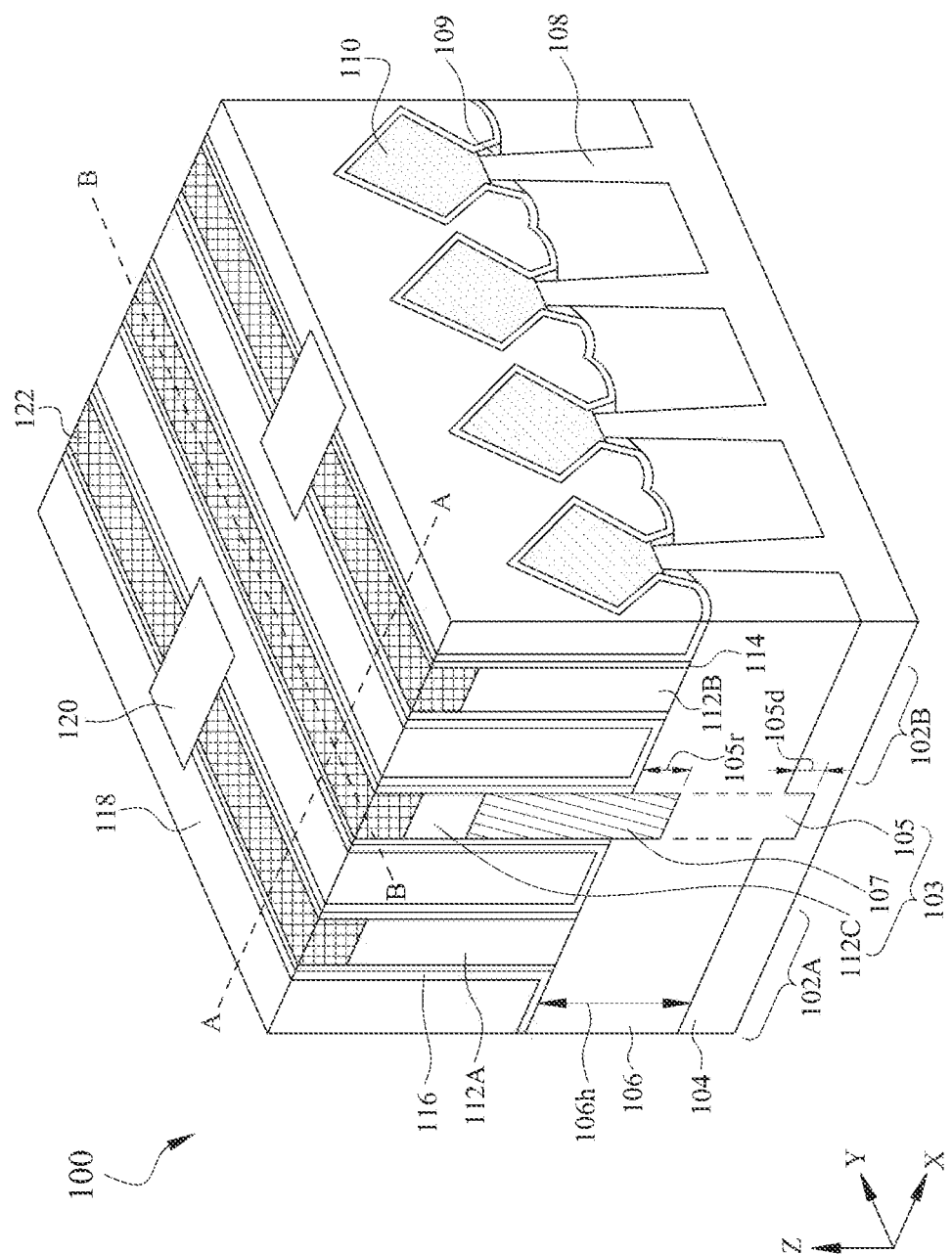
FIG. 1 illustrates an isometric view of a semiconductor device having an isolation structure with a protection layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

With continuous scaling down of the dimensions, semiconductor devices are placed in increasingly closer proximity and higher density, resulting in increased coupling effect between adjacent semiconductor devices in abutted active regions. The abutted active regions can be abutted well regions or abutted standard cells. The increased coupling effect results in significant noise increases, signal delays, logic errors, and even integrated circuit (IC) malfunctions. Isolation of the adjacent semiconductor devices in abutted active regions can help prevent the coupling effect, thereby improving IC performance.

The adjacent semiconductor devices in abutted active regions can be isolated by an isolation structure aligned with a middle line between the abutted active regions to reduce the coupling effect. In some embodiments, a continuous poly on oxide definition edge (CPODE) pattern can be used to form the isolation structure. The term "oxide definition" can define an active region located adjacent to the isolation structure. In some embodiments, the isolation structure can include a dielectric structure to isolate the abutted active regions. In some embodiments, the isolation structure can include a metal gate structure on a dielectric structure to improve polishing uniformity of metal gate structures in subsequent polishing processes. However, the isolation structure can have its challenges. The metal gate structure of the isolation structure is located close to source/drain (S/D)

structures of adjacent semiconductor devices. The metal gate structure can extrude into the S/D structures due to an over etch during the formation of S/D structures. The over etch can be worse with an increase of metal gate structure dimensions and/or an overlay shift of the metal gate structure.

Various embodiments in the present disclosure provide example methods for forming a protection layer in an isolation structure between adjacent field effect transistors (FET) devices (e.g., finFETs, gate-all-around FETs, and MOSFETs) and/or other semiconductor devices in an IC. The example methods in the present disclosure can form an isolation structure on a substrate between adjacent semiconductor devices in abutted active regions. The isolation structure can include a dielectric structure, a gate structure, and a protection layer between the dielectric structure and the gate structure. The protection layer can be disposed between the gate structure and S/D structures of adjacent semiconductor devices to prevent the extrusion of the gate structure due to the over etch during the formation of the S/D structures. The dimensions of the protection layer and the dielectric structures can be controlled to minimize parasitic capacitances between the gate structure and the S/D structures. In some embodiments, the protection layer can reduce about 75% to about 95% extrusions of the gate structure in the isolation structure.

Figure 2:
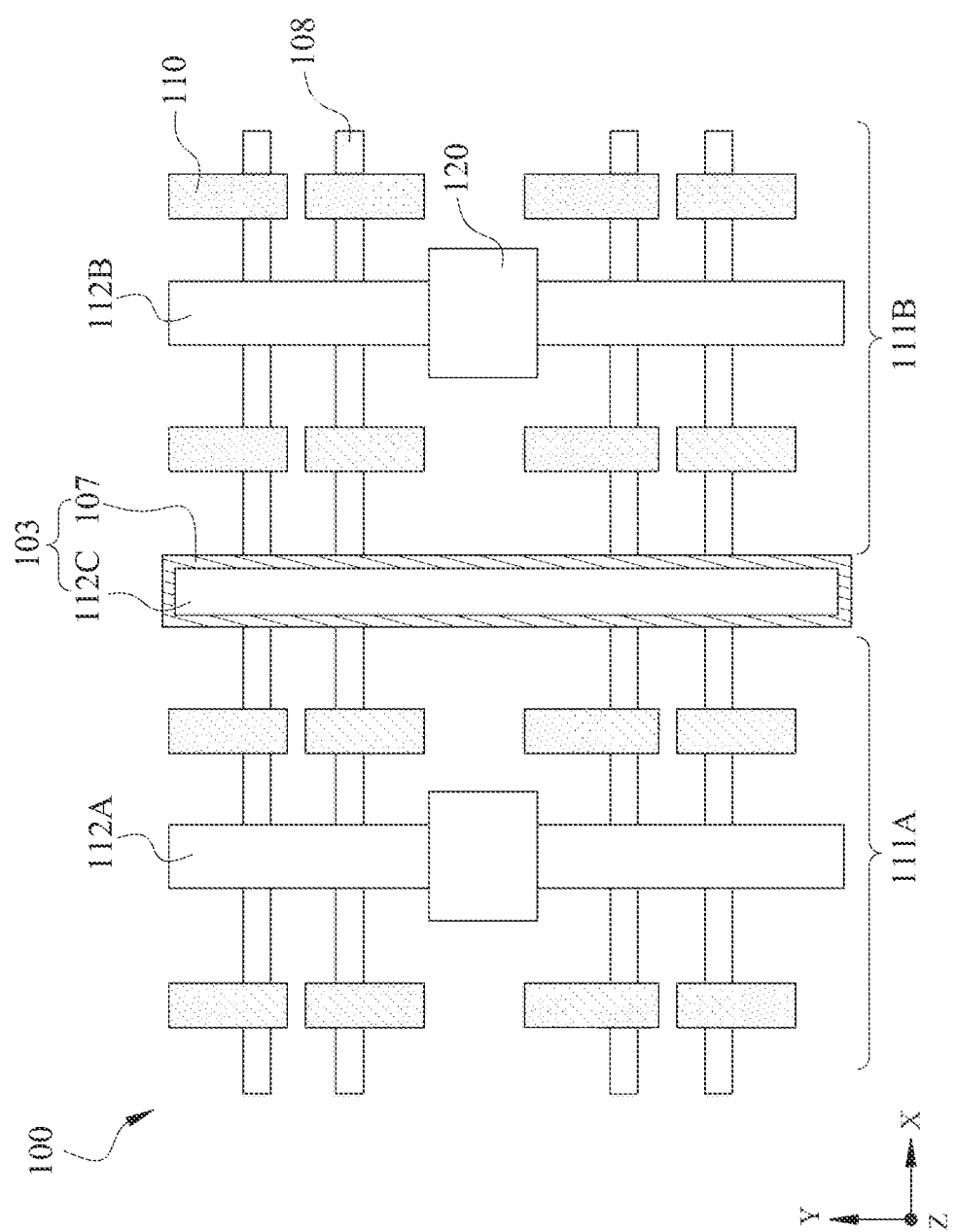
FIG. 2 illustrates a schematic plan view of a semiconductor device having an isolation structure with a protection layer, in accordance with some embodiments.
Figure 3:
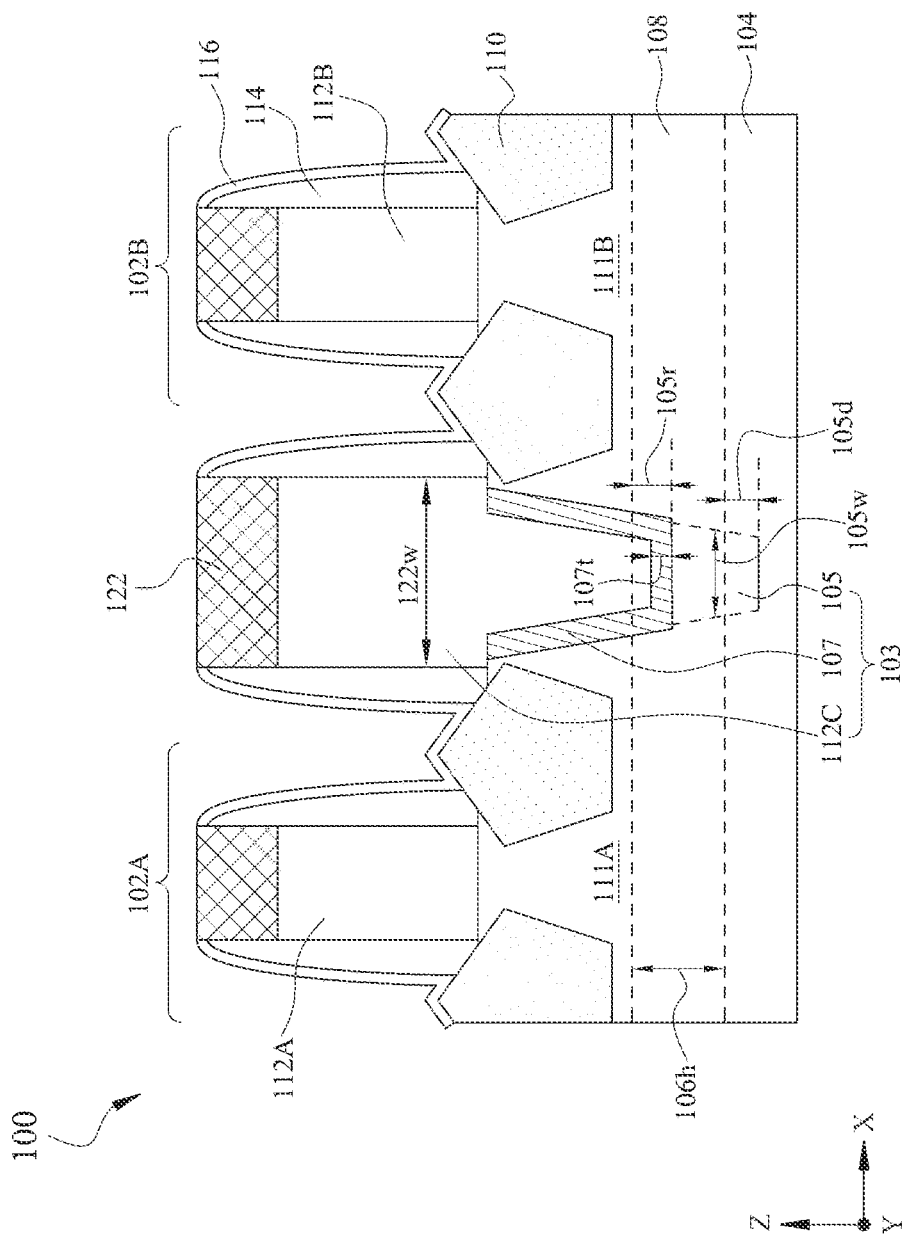
FIGS. 3 and 4 illustrate cross-sectional views of a semiconductor device having an isolation structure with a protection layer, in accordance with some embodiments.
Figure 4:
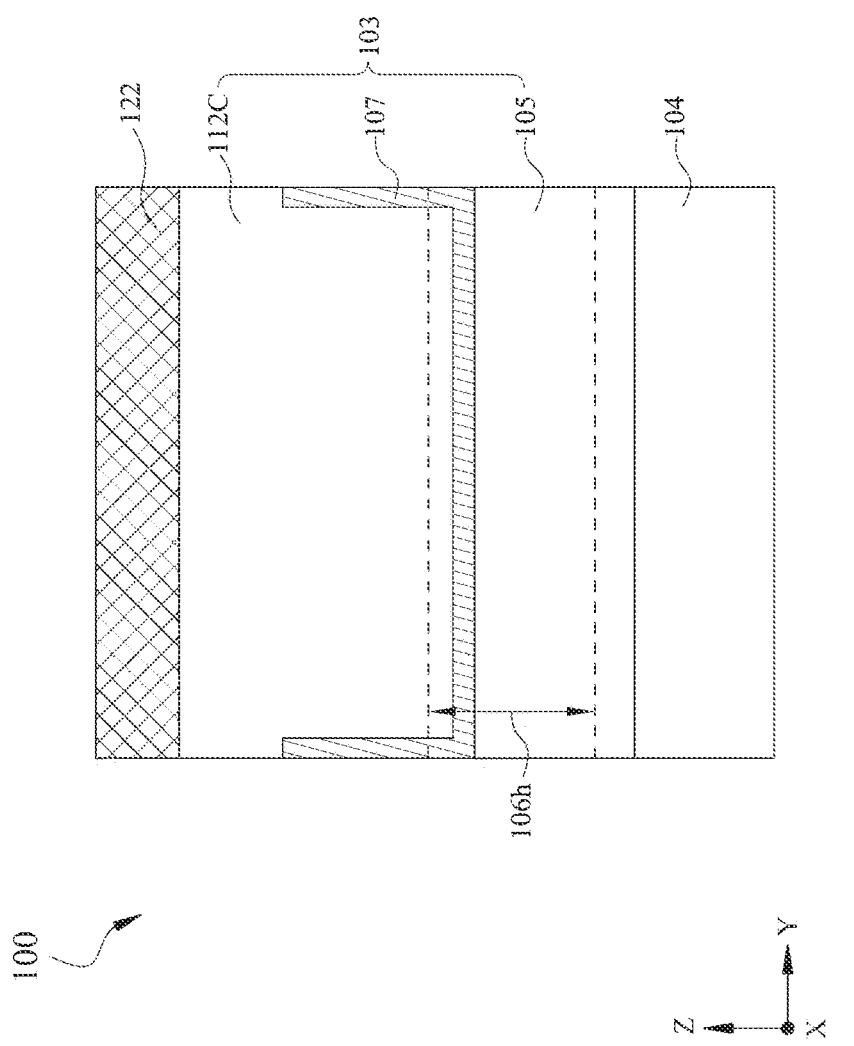

FIG. 1 illustrates an isometric view of a semiconductor device 100 having an isolation structure 103 with a protection layer 107, in accordance with some embodiments. Semiconductor device 100 can have finFETs 102A and 102E separated by isolation structure 103. FIG. 2 illustrates a schematic plan view of semiconductor device 100 having isolation structure 103, in accordance with some embodiments. FIG. 3 illustrates a cross-sectional view of semiconductor device 100 having isolation structure 103 along line A-A in FIG. 1, in accordance with some embodiments. FIG. 4 illustrates a cross-sectional view of semiconductor device 100 having isolation structure 103 along line B-B in FIG. 1, in accordance with some embodiments, Referring to FIGS. 1-4, semiconductor device 100 having finFETs 102A and 102B separated by isolation structure 103 can be formed on a substrate 104 and can include fin structures 108, shallow trench isolation (STI) regions 106, S/D structures 110, gate structures 112A-112C, fin sidewall structures 109, gate spacers 114, etch stop layer (ESL) 116, interlayer dielectric (ILD) layer 118, fill structures 120, and hard mask layer 122.

As shown in FIG. 3, finFETs 102A and 102B can be formed on abutted active regions 111A and 111B, respectively. In some embodiments, active regions 111A and 111B can be abutted well regions or abutted standard cells. In some embodiments, finFETs 102A and 102B can be both n-type finFETs (NFETs). In some embodiments, finFET 102A can be an NFET and have n-type S/D structures 110. FinFET 102B can be a p-type finFET (PFET) and have p-type S/D structures 110. In some embodiments, finFETs 102A and 102B can be both PFETs. Though FIGS. 1-4 show two finFETs 102A and 102B on abutted active regions 111A and 111B, semiconductor device 100 can have any number of finFETs in active regions 111A and 111B. In addition, semiconductor device 100 can be incorporated into an IC through the use of other structural components, such as contact structures, conductive vias, conductive lines, dielectric layers, passivation layers, and interconnects, which are not shown for simplicity. ESL 116 and ILD layer 118 are not shown in FIG. 2 and ILD layer 118 is not shown in FIG. 3 for simplicity. The discussion of elements of finFETs 102A and 102B with the same annotations applies to each other, unless mentioned otherwise. And like reference numerals generally indicate identical, functionally similar, and/or structurally similar elements.

Referring to FIGS. 1-4, substrate 104 can include a semiconductor material, such as silicon. In some embodiments, substrate 104 includes a crystalline silicon substrate (e.g., wafer). In some embodiments, substrate 104 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 104 can be doped depending on design requirements p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 can provide electrical isolation between finFET 102A and 102B from each other and from neighboring finFETs (not shown) on substrate 104 and/or neighboring active and passive elements (not shown) integrated with or deposited on substrate 104. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure. In some embodiments, STI regions 106 can have a height $106h$ along a Z-axis ranging from about 40 nm to about 80 nm.

Referring to FIGS. 1-3, fin structures 108 can be formed from patterned portions of substrate 104. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

Referring to FIGS. 1-3, fin structures 108 can extend along an X-axis and through finFETs 102A and 102B. Fin structures 108 can include active region 111A and active region 111B disposed on substrate 104, as shown in FIGS. 2 and 3. In some embodiments, the formation of active regions 111A and 111B can include an implantation process. Active regions 111A and 111B can include the same type of dopant or different types of dopant. In some embodiments, fin structures 108 can include a semiconductor material similar to or different from substrate 104. In some embodiments, fin structures 108 can include silicon. In some embodiments, fin structures 108 can include silicon germanium. In FIGS. 1-3, fin structures 108 under gate structures 112A-112B can form channel regions of semiconductor device 100 and represent current carrying structures of semiconductor device 100.

S/D structures 110 can be disposed on opposing sides of gate structures 112A-112B and function as S/D regions of semiconductor device 100. Referring to FIGS. 1-3, S/D structures 110 can be disposed on fin structures 110 on opposing sides of gate structures 112A-112B. In some embodiments, S/D structures 110 can have any geometric shape, such as a polygon, an ellipsis, and a circle. In some embodiments, S/D structures 110 can include an epitaxially-grown semiconductor material the same as the material of fin structures 108. In some embodiments, the epitaxially-grown semiconductor material can include a material different from the material of fin structures 108 and imparts a strain on the channel regions under gate structures 112A-112B. Since the lattice constant of such epitaxially-grown semiconductor material is different from the material of fin structures 108, the channel regions are strained to advantageously increase carrier mobility in the channel regions of semiconductor device 100. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D structures 110 can include silicon and can be in-situ doped during an epitaxial growth process using n-type dopants, such as phosphorus and arsenic. In some embodiments, S/D structures 110 can include silicon, silicon germanium, germanium, or III-V materials (e.g., indium antimonide, gallium antimonide, or indium gallium antimonide) and can be in-situ doped during an epitaxial growth process using p-type dopants, such as boron, indium, and gallium. In some embodiments, S/D structures 110 can include one or more epitaxial layers and each epitaxial layer can have different compositions.

Referring to FIGS. 1-4, gate structures 112A-112C can be multi-layered structures and can be disposed on fin structures 108 and protection layer 107, respectively. Each of gate structures 112A-112C can include an interfacial layer, a high-k gate dielectric layer, a work-function layer, and a gate electrode. The term "high-k" can refer to a high dielectric constant. In the field of semiconductor device structures and manufacturing processes, high-k can refer to a dielectric constant that is greater than the dielectric constant of silicon oxide (e.g., greater than about 3.9). In some embodiments, the interfacial layer can be disposed on fin structures 108 and can include silicon oxide. In some embodiments, the high-k gate dielectric layer can be disposed on the interfacial layer and can include hafnium oxide ($HfO_2$), zirconium oxide ($ZrO_2$), and other suitable high-k dielectric materials. The work-function layer can be disposed on the high-k gate dielectric layer and can include work-function metals to tune threshold voltage ($V_t$) of finFETs 102A and 102B. In some embodiments, the work-function layer can include titanium nitride, ruthenium, titanium aluminum, titanium aluminum carbon, tantalum aluminum, tantalum aluminum carbon, or other suitable work-function metals. In some embodiments, the work-function layer can include a single metal layer or a stack of metal layers. The stack of metal layers can include work-function metals having work-function values equal to or different from each other. The gate electrode can include titanium, tantalum, aluminum, cobalt, tungsten, nickel, ruthenium, and other suitable conductive materials.

Isolation structure 103 can be disposed on substrate 104 and can include a dielectric structure 105, protection layer 107, and gate structure 112C. In some embodiments, isolation structure 103 can be aligned with a middle line between abutted active regions 111A and 111B to reduce the coupling effect between adjacent finFETs 102A and 102B, as shown in FIGS. 2 and 3. In some embodiments, dielectric structure 105 can extend into substrate 104 by a distance 105d along a Z-axis ranging from about 100 nm to about 150 nm to isolate abutted active regions 111A and 111B. If distance 105d is less than about 100 nm, dielectric structure 105 may not isolate abutted active regions 111A and 111B. If distance 105d is greater than about 150 nm, the isolation between abutted active regions 111A and 111B may not be further improved and the manufacturing cost may increase.

In some embodiments, dielectric structure 105 and STI regions 106 can be formed in the same process and can include the same dielectric material. In some embodiments, a recess 105r along a Z-axis between top surfaces of dielectric structure 105 and STI regions 106 can range from about 10 nm to about 30 nm. With recess 105r, protection layer 107 can fully separate gate structure 112C and S/D structures 110. If recess 105r is less than about 10 nm, protection layer 107 may not prevent extrusion of gate structure 112C into S/D structures 110 and fin structures 108. If recess 105r is greater than about 30 nm, a dimension of protection layer 107 between gate structure 112C and S/D structures 110 may increase and the parasitic capacitance between gate structure 112C and S/D structures 110 may increase. In some embodiments, dielectric structure 105 can have sloped sidewall surfaces after actual processes, as shown in FIG. 2. A top portion of dielectric structure 105 can have a width 105w greater than that of a bottom portion of dielectric structure 105. In some embodiments, width 105w of dielectric structure 105 can range from about 5 nm to about 20 nm.

Protection layer 107 can be disposed on dielectric structure 105 and sidewall surfaces of fin structures 108. As shown in FIGS. 1-4, protection layer 107 can surround gate structure 112C and prevent extrusions of gate structure 112C into S/D structures 110 and fin structures 108. In some embodiments, protection layer 107 can have a thickness 107t ranging from about 2 nm to about 10 nm. If thickness 107t is less than about 2 nm, protection layer 107 may not prevent extrusions of gate structure 112C. If thickness 107t is greater than about 10 nm, a dimension of protection layer 107 between gate structure 1120 and S/D structures 110 may increase and the parasitic capacitance between gate structure 112C and S/D structures 110 may increase.

Referring to FIGS. 1-4, gate structure 112C can be disposed on protection layer 107. In some embodiments, gate structures 112A-112C can be formed in the same process. In some embodiments, gate structure 112C can have a width 112w along an X-axis greater than width 105w of dielectric structure 105 to have additional tolerance for gate structure overlay shift. In some embodiments, width 112w can range from about 15 nm to about 35 nm. In some embodiments, a difference between width 112w and width 105w can range from about 1 nm to about 10 nm to prevent gate structure overlay shift. In some embodiments, gate structure 1120 can include the interfacial layer, the high-k gate dielectric layer, the work-function layer, and the gate electrode. Gate structure 112C can be separated from dielectric structure 105 and S/D structures 110 by protection layer 107. Protection layer 107 can prevent extrusions of gate structure 112C due to the over etch during the formation of S/D structures 110. In some embodiments, protection layer 107 can reduce about 75% to about 95% extrusions of gate structure 112C into isolation structure 103.

Referring to FIGS. 1 and 3, gate spacers 114 can be disposed on sidewalls of gate structures 112A-112C and fin sidewall spacers 109 can be disposed on sidewalk of fin structures 108. Gate spacers 114 and fin sidewall spacers 109 can include insulating materials, such as silicon oxide, silicon nitride, silicon oxynitride, silicon carbonitride, silicon oxycarbide, silicon oxycarbonitride, a low-k material, and a combination thereof. Gate spacers 114 and fin sidewall spacers 109 can include a single layer or a stack of insulating layers. Gate spacers 114 and fin sidewall spacers 109 can have a low-k material with a dielectric constant less than about 3.9 (e.g., about 3.5, about 3.0, or about 2.8).

ESL 116 can be disposed on STI regions 106, S/D structures 110, and sidewalk of gate spacers 114 and fin sidewall spacers 109. ESL 116 can be configured to protect STI regions 106, S/D structures 110, and gate structures 112A-112C during the formation of S/D contact structures on S/D structures 110. In some embodiments, ESL 116 can include, for example, silicon oxide, silicon nitride, silicon oxynitride, silicon carbide, silicon carbonitride, boron nitride, silicon boron nitride, silicon carbon boron nitride, or a combination thereof.

ILD layer 118 can be disposed on ESL 116 over S/D structures 110 and STI regions 106. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide.

Fill structures 120 can be disposed in gate structures 112A-112B to separate gate structures into shorter portions, as shown in FIGS. 1 and 2. In some embodiments, fill structures 120 can include a nitrogen-based dielectric material. Hard mask layer 122 can be disposed on gate structures 112A-112C to protect gate structures 112A-112C during formation of S/D contact structures 110 and other processes. In some embodiments, hard mask layer 122 can include a nitrogen-based dielectric material.

Figure 5:
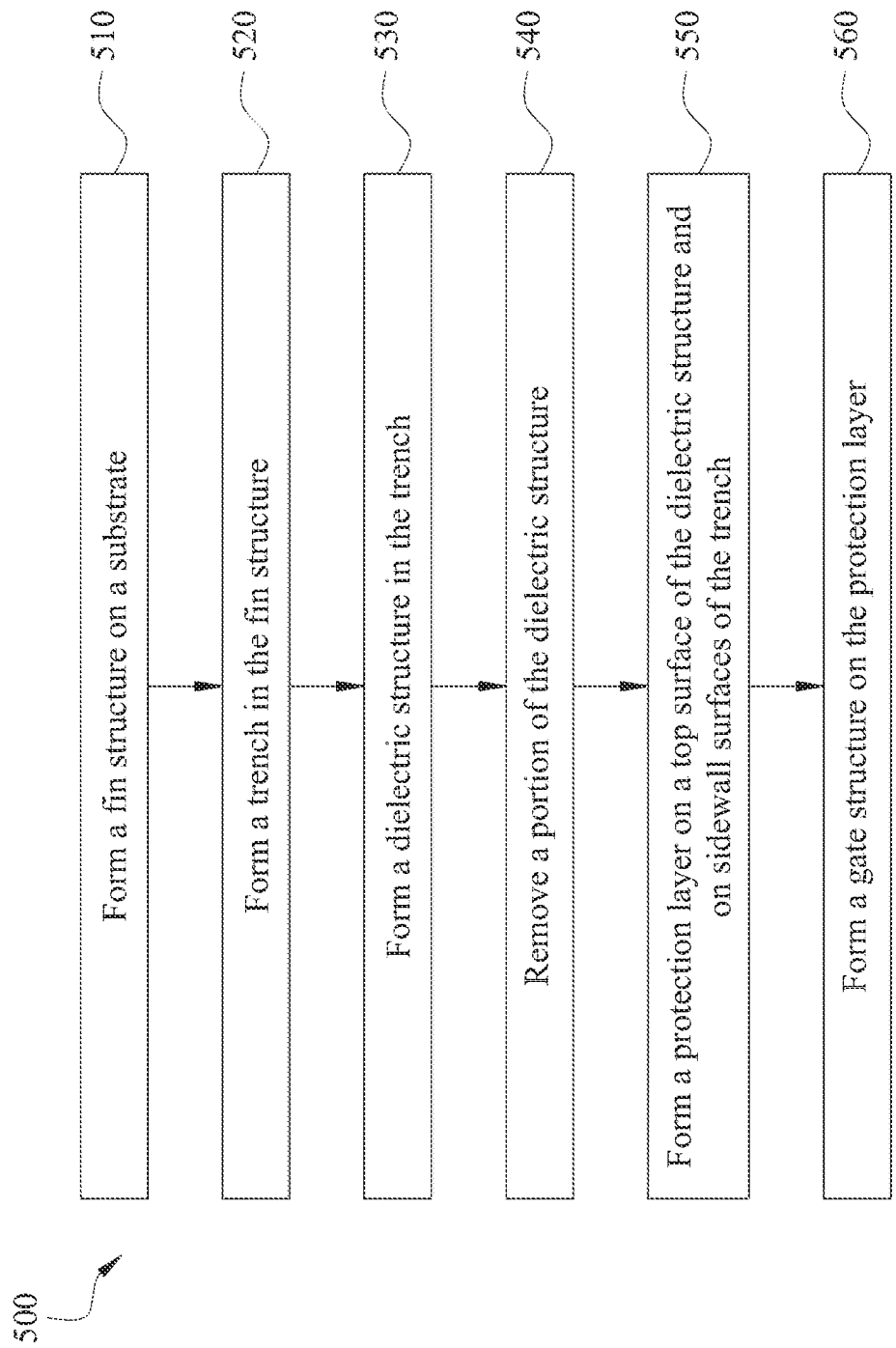
FIG. 5 is a flow diagram of a method for fabricating a semiconductor device having an isolation structure with a protection layer, in accordance with some embodiments.

FIG. 5 is a flow diagram of a method 500 for fabricating semiconductor device 100 having isolation structure 103 with protection layer 107, in accordance with some embodiments. Method 500 may not be limited to finFET devices and can be applicable to devices that would benefit from protection layers in isolation structures, such as planar FETs, finFETs, gate-all-around FETs, and other semiconductor devices. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

For illustrative purposes, the operations illustrated in FIG. 5 will be described with reference to the example fabrication process for fabricating semiconductor device 100 as illustrated in FIGS. 6-12. FIGS. 6-12 illustrate isometric and cross-sectional views of semiconductor device 100 having isolation structure 103 with protection layer 107 at various stages of its fabrication, in accordance with some embodiments. Elements in FIGS. 6-12 with the same annotations as elements in FIGS. 1-4 are described above.

Figure 6:
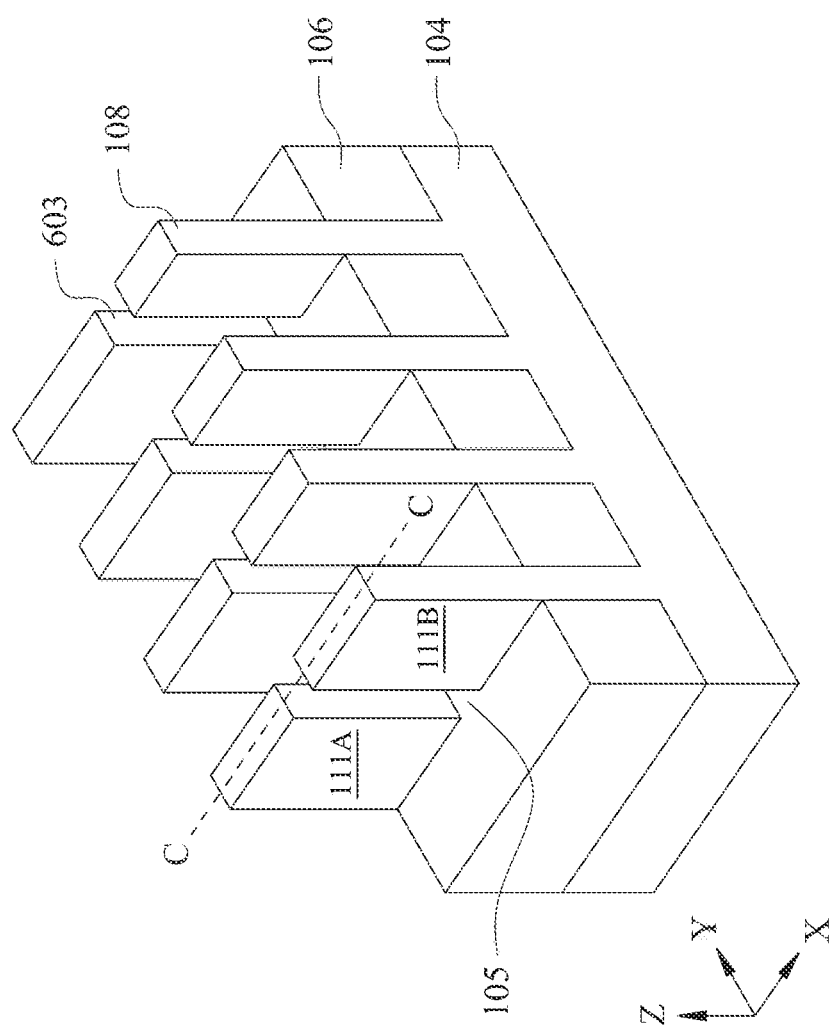
FIGS. 6-12 illustrate isometric and cross-sectional views of a semiconductor device having an isolation structure with a protection layer at various stages of its fabrication, in accordance with some embodiments.

In referring to FIG. 5, method 500 begins with operation 510 and the process of forming a fin structure on a substrate. For example, as shown in FIG. 6, fin structures 108 can be formed on substrate 104. Fin structures 108 can be formed from patterned portions of substrate 104 and can include the same material as substrate 104, In some embodiments, fin structures 108 and substrate 104 can include silicon. In some embodiments, fin structures 108 and substrate 104 can include silicon germanium.

Figure 7:
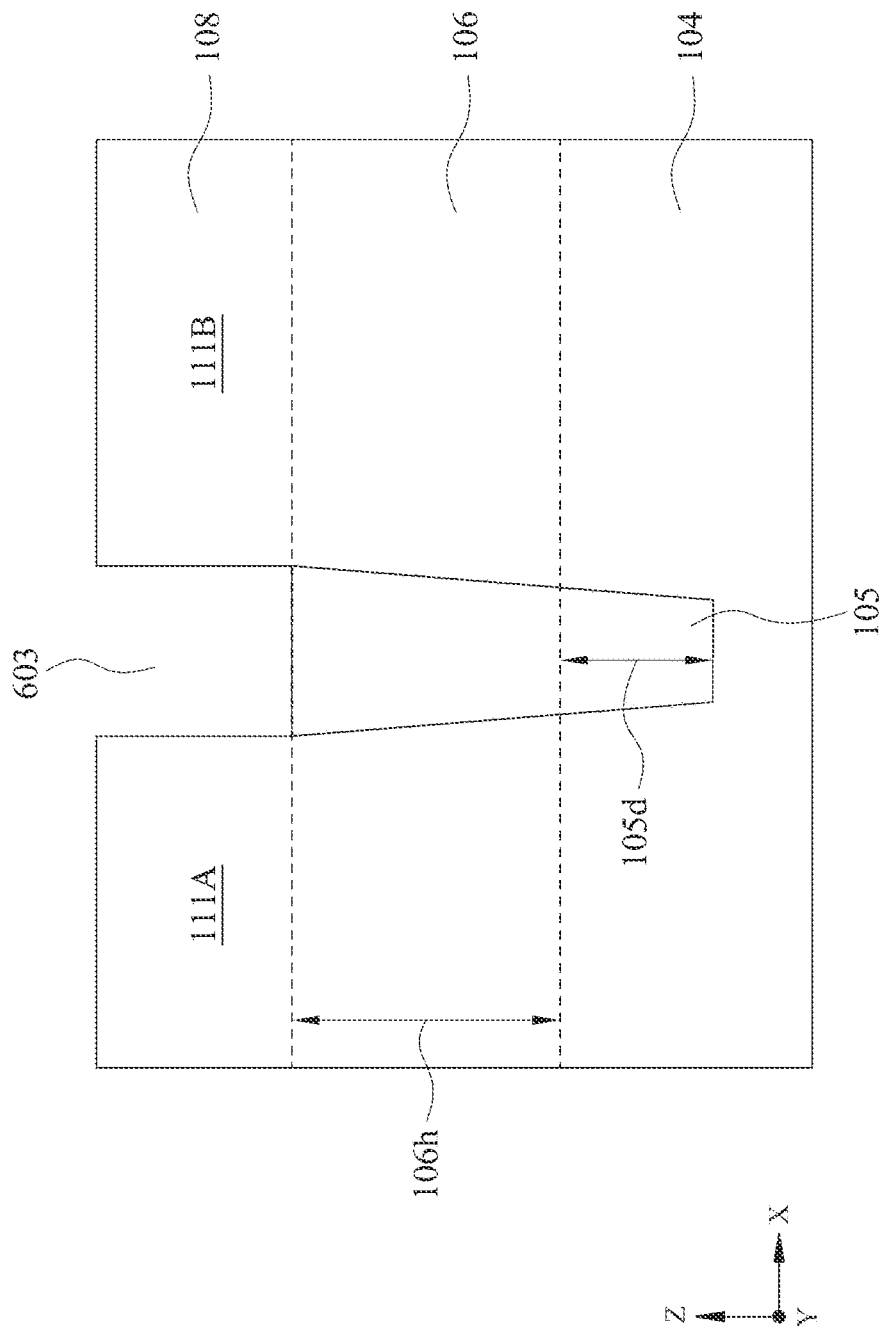

Referring to FIG. 5, in operation 520, a trench is formed in the fin structure. For example, as shown in FIG. 6, trench 603 can be formed in fin structures 108. In some embodiments, trench 603 can be formed by a patterning process followed by an etch process to separate active regions 111A and 111B. In some embodiments, trench 603 can extend into substrate 104 to fully separate active regions 111A and 111B, as shown in FIG. 7. In some embodiments, trench 603 can extend into substrate by distance $105d$ ranging from about 100 nm to about 150 nm.

Referring to FIG. 5, in operation 530, a dielectric structure is formed in the trench. For example, as shown in FIGS. 6 and 7, dielectric structure 105 can be formed in trench 603. In some embodiments, dielectric structure 105 and STI regions 106 can be formed by the same process. The formation of dielectric structure 105 and STI regions 106 can include (i) depositing a layer of insulating material on substrate 104 and fin structures 108, (ii) annealing the layer of insulating material, (iii) chemical mechanical polishing (CMP) the annealed layer of insulating material, and (iv) etching back the polished structure to expose fin structures 108 and form dielectric structure 105 and STI regions 106 in FIGS. 6 and 7. In some embodiments, the layer of insulating material can include silicon oxide, silicon nitride, silicon oxynitride, FSG, a low-k dielectric material, and/or other suitable insulating materials deposited by chemical vapor deposition (CVD) or other suitable deposition methods. In some embodiments, dielectric structure 105 can extend into substrate 104 by distance $105d$ ranging from about 100 nm to about 150 nm. In some embodiments, STI regions 106 can have height $106h$ along a Z-axis ranging from about 40 nm to about 80 nm.

Figure 8:
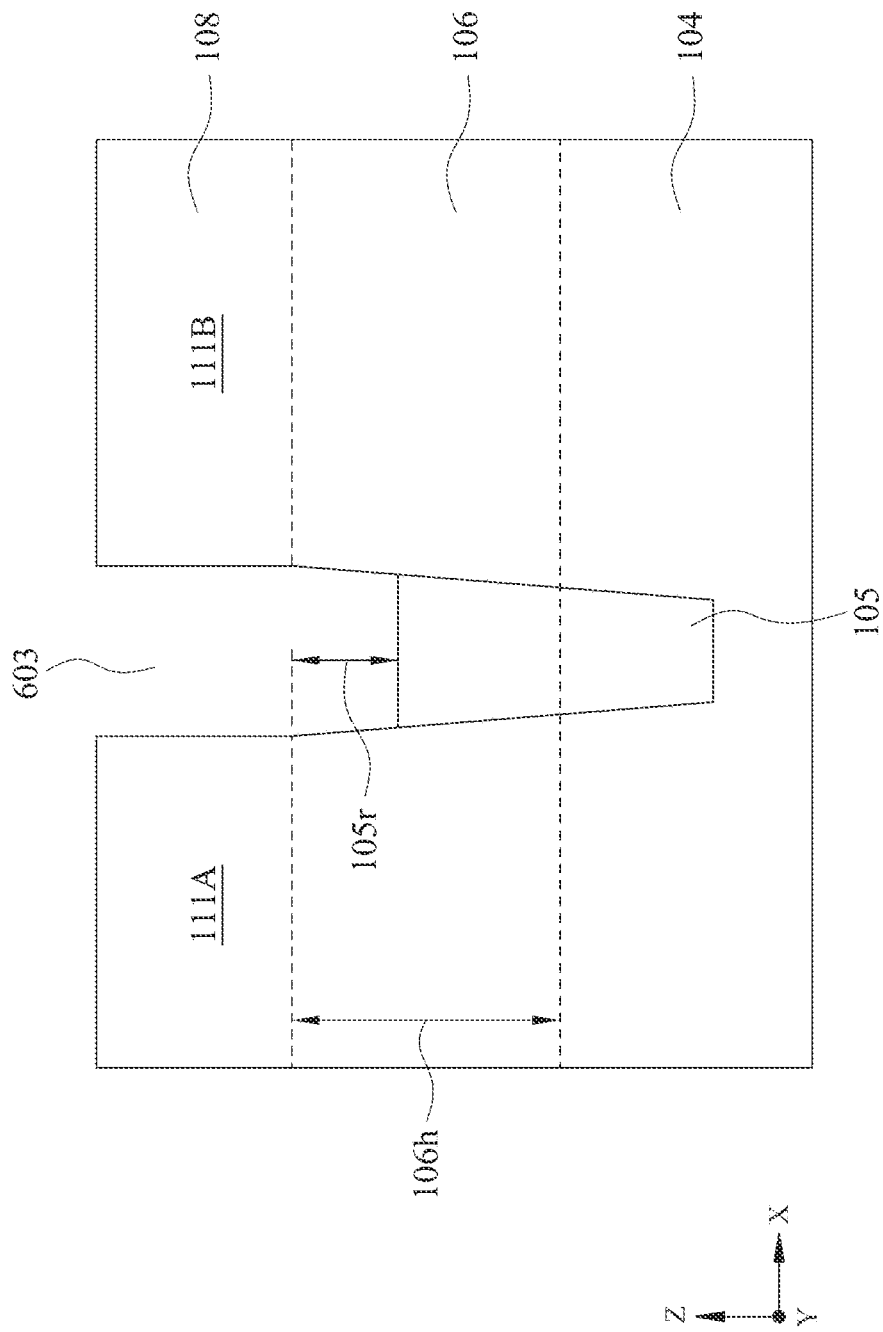

Referring to FIG. 5, in operation 540, a portion of the dielectric structure is removed. For example, as shown in FIG. 8, a top portion of dielectric structure 105 can be removed and dielectric structure 105 can be recessed by recess $105r$ ranging from about 10 nm to about 30 nm. With recess $105r$, protection layer 107 can better prevent extrusions of the gate structure formed on dielectric structure 105 in subsequent processes. In some embodiments, dielectric structure 105 can be recessed by a plasma dry etch at a temperature from about 30° C. to about 70° C. under a pressure from about 0.1 mtorr to about 30 mtorr. The plasma dry etch can include etchants, such as carbon tetrafluoride ($CF_4$), difluoromethane ($CH_2F_2$), sulfur hexafluoride ($SF_6$), hydrogen bromide (HBr), and oxygen ($O_2$). The etchants can be carried by carrier gases, such as argon (Ar), helium (He), and nitrogen ($N_2$). In some embodiments, a plasma power of the plasma dry etch process can range from about 0.1 V to about 1000 V. In some embodiments, a flow rate of the etchants can range from about 0.1 standard cubic centimeter per minute (sccm) to about 450 sccm. The parameters for the plasma dry etch can be controlled within these ranges to adjust recess $105r$ from about 10 nm to about 30 nm.

Figure 9:
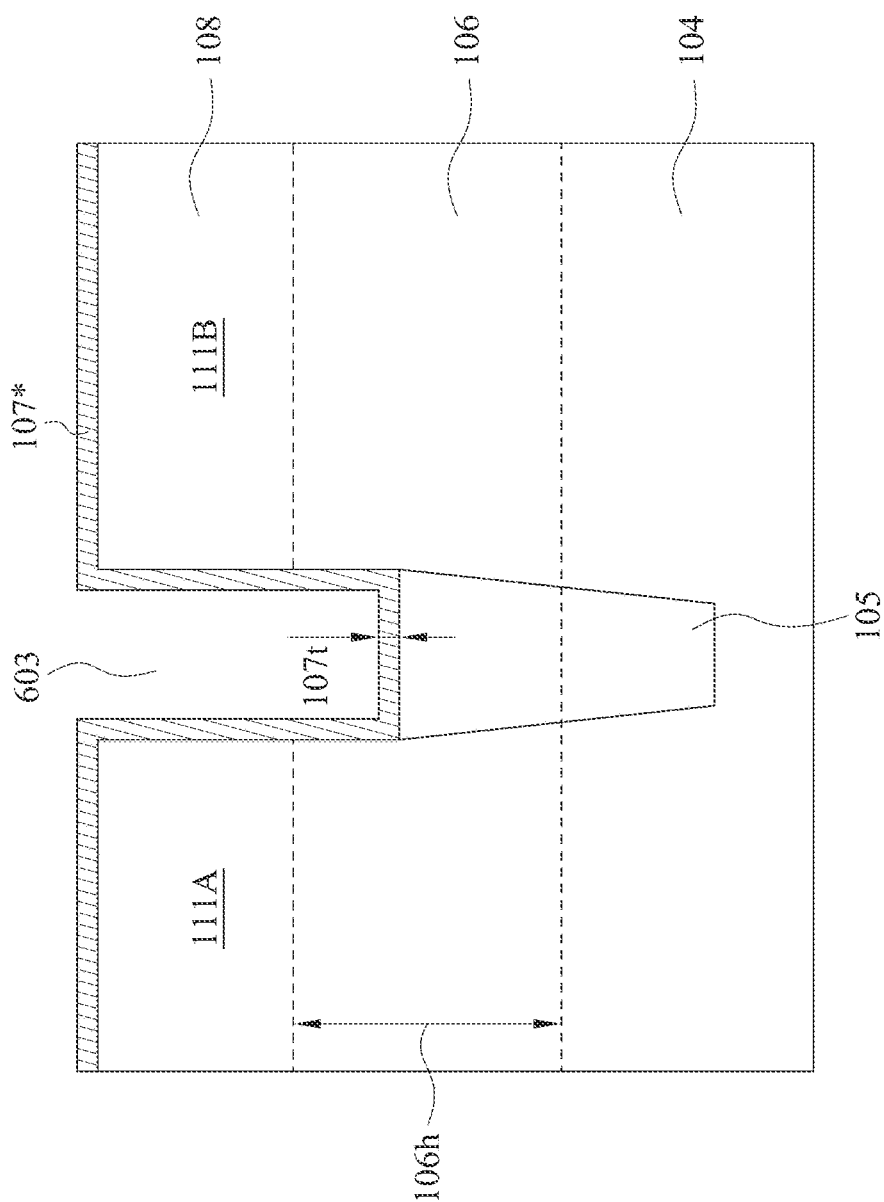
Figure 10:
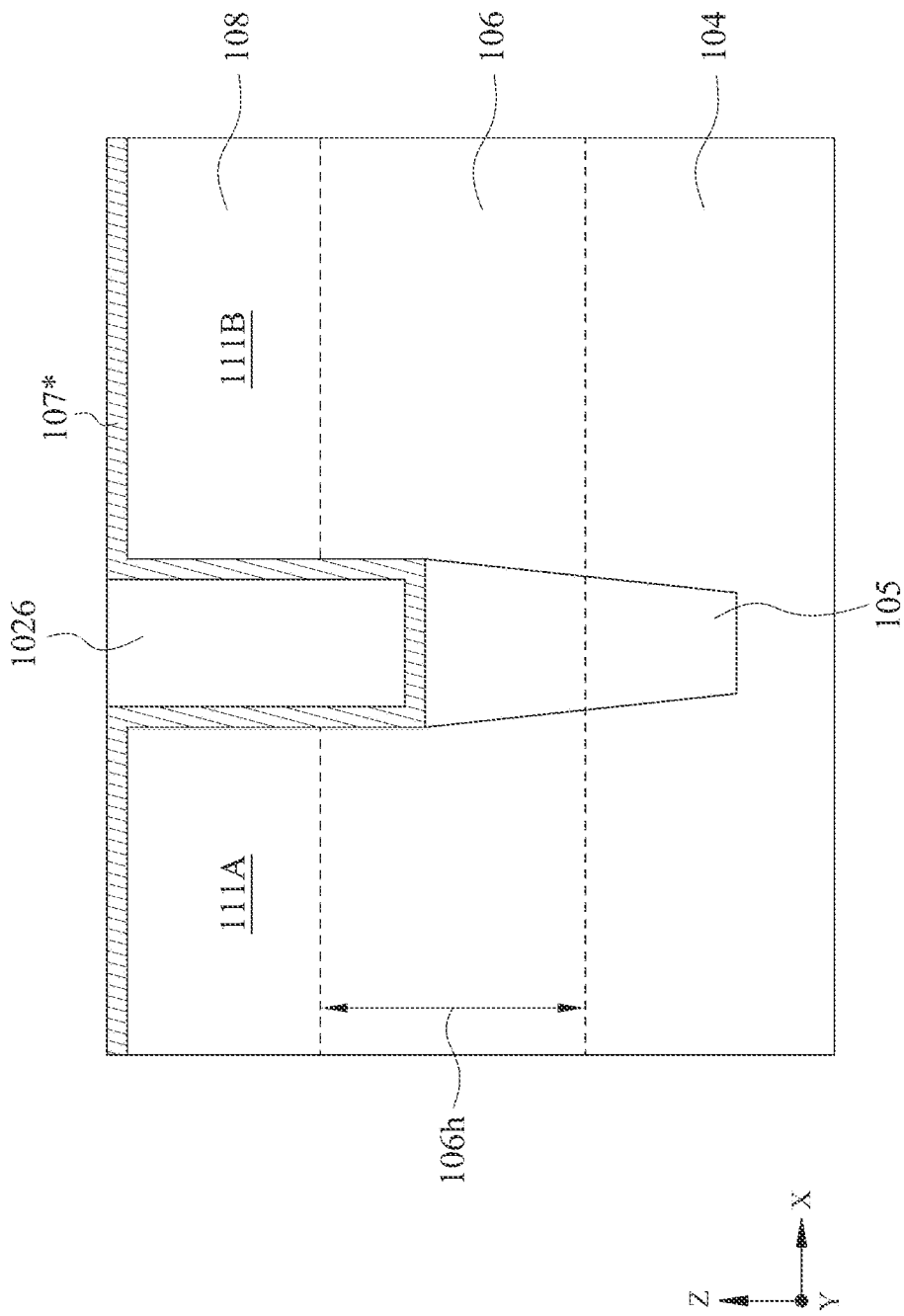
Figure 11:
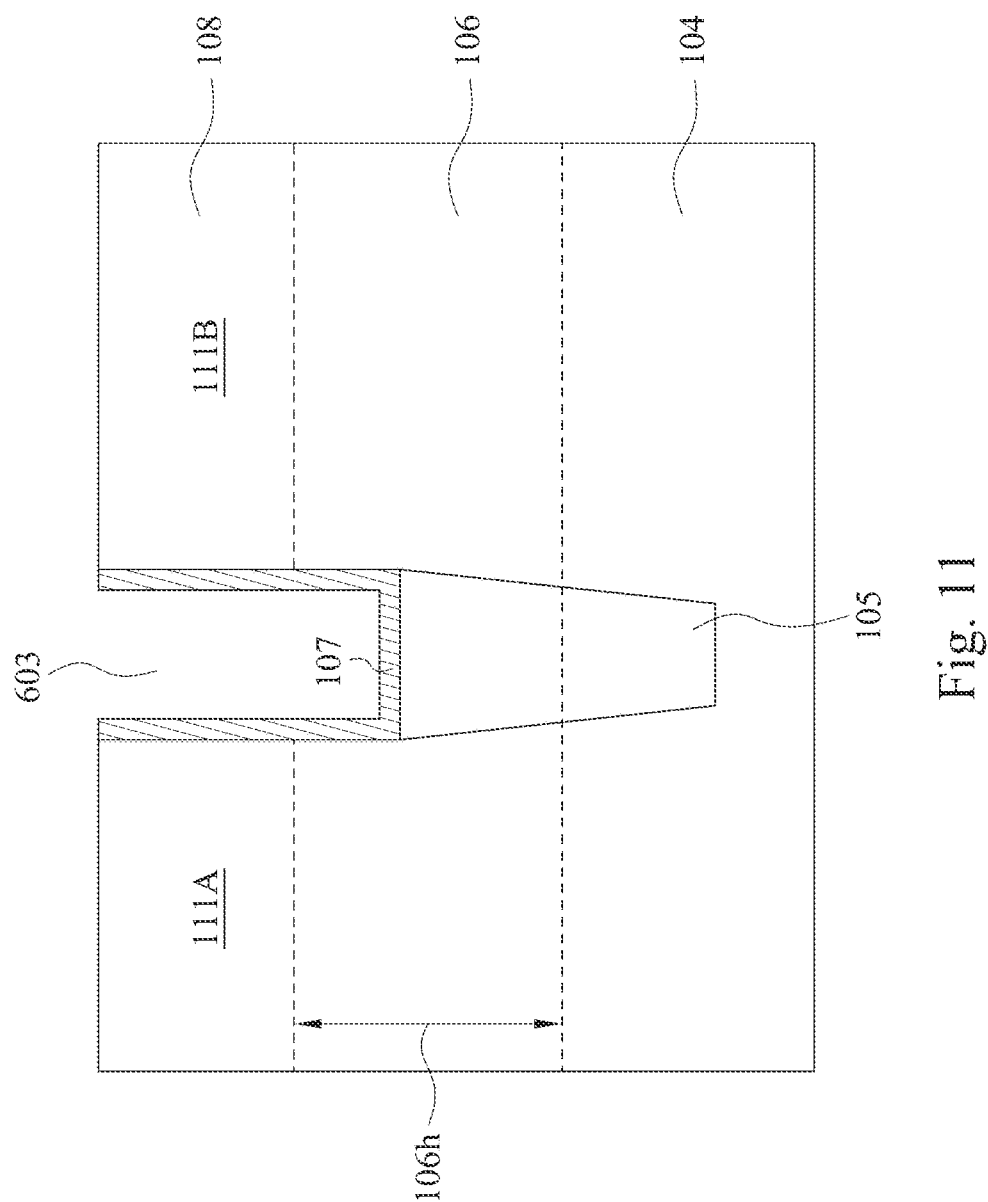

Referring to FIG. 5, in operation 550, a protection layer is formed on a top surface of the dielectric structure and on sidewall surfaces of the trench. For example, as shown in FIGS. 9-11, protection layer 107 can be formed on the top surface of dielectric structure 105 and on sidewall surfaces of trench 603. The formation of protection layer 107 can include depositing a layer 107* of dielectric material and remove a portion of layer 107* of dielectric material outside trench 603. In some embodiments, the dielectric material can include a nitrogen-based dielectric material, such as silicon nitride, silicon carbonitride, and silicon oxycarbonitride. In some embodiments, layer 107* of dielectric material can be blanket deposited on fin structures 108 and in trench 603 by CVD, plasma enhanced CVD (PECVD), atomic layer deposition (ALD), and other suitable deposition methods. Deposition of layer 107* of dielectric material can include precursors, such as dichlorosilane (DCS) and ammonia ($NH_3$). In some embodiments, layer 107* of dielectric material can be deposited at a temperature from about 500° C. to about 650° C. under a pressure from about 1 mtorr to about 10 mtorr.

The deposition of layer 107* of dielectric material can be followed by removing a portion of layer 107* of dielectric material outside trench 603. For example, as shown in FIG. 10, a photomask structure 1026 can be formed to fill trench 603. The formation of photomask structure 1026 can include blanket depositing a photomask layer on layer 107* of dielectric material and patterning and removing a portion of the photomask layer outside trench 603 to form photomask structure 1026 in trench 603. A portion of layer 107* of dielectric material can be removed from fin structures 108 outside of trench 603 to form protection layer 107, as shown in FIG. 11. In some embodiments, the portion of layer 107* of dielectric material can be removed by a wet etching process or a dry etching process, After formation of dielectric layer 107, photomask structure 1026 can be removed from trench 603.

Figure 12:
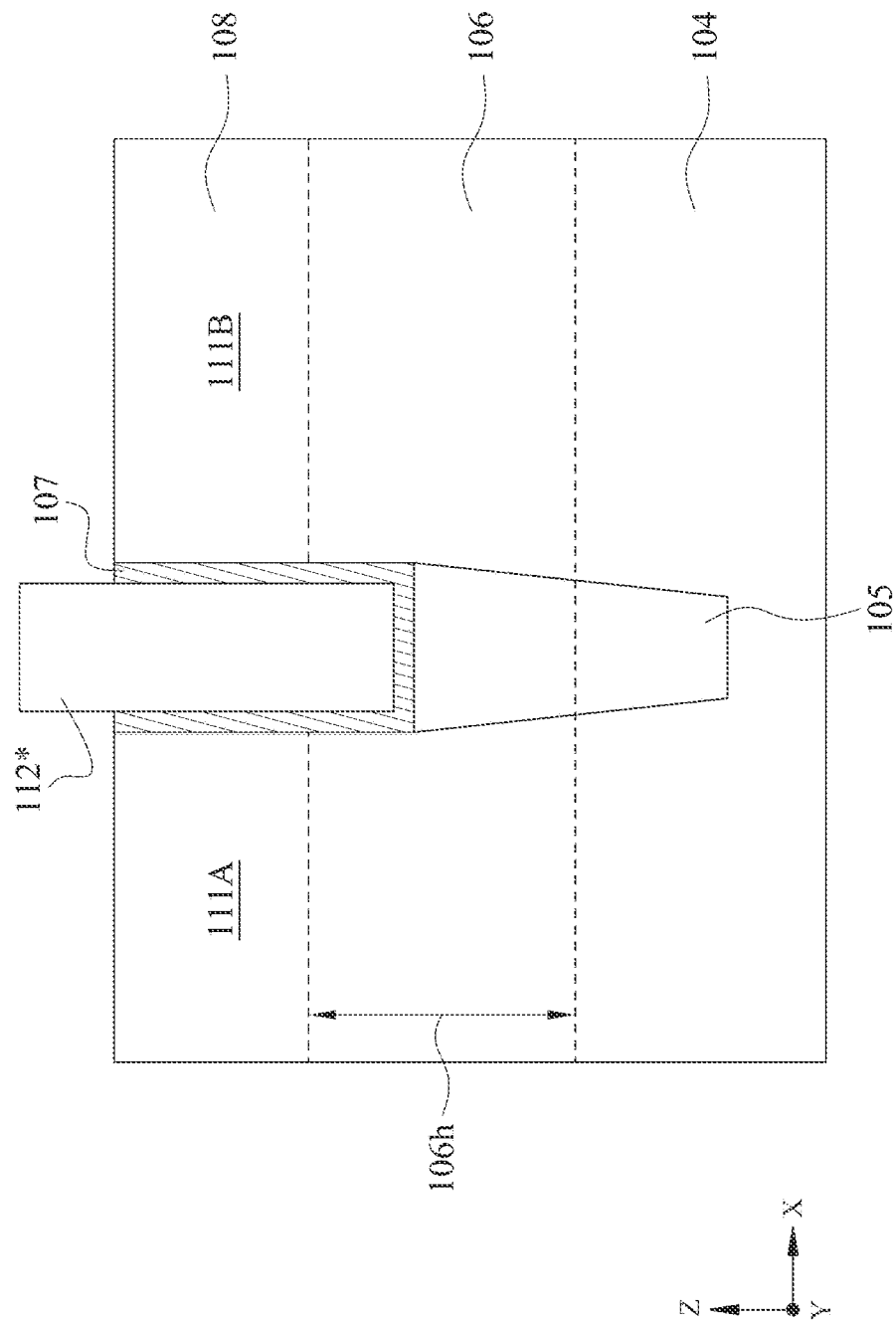

Referring to FIG. 5, in operation 560, a gate structure is formed on the protection layer. For example, as shown in FIG. 12, gate structure 112* can be patterned and formed on protection layer 107. In some embodiments, gate structure 112* can be formed by a blanket deposition of polysilicon, followed by photolithography and etching of the deposited polysilicon. The deposition process can include CVD, ALD, physical vapor deposition (PVD), other suitable deposition methods, or a combination thereof. The photolithography can include photoresist coating (e.g., spin-on coating), soft baking, mask aligning, exposure, post-exposure baking, developing the photoresist, rinsing, drying (e.g., hard baking), other suitable processes, or a combination thereof. The etching process can include dry etching, wet etching, and/or other etching methods (e.g., reactive ion etching). In some embodiments, a hard mask layer (not shown) can be patterned on gate structure 112* to protect gate structure 112* in subsequent processing steps.

The formation of gate structure 112* can be followed by formation of S/D structures 110 on fin structures 108, as shown in FIGS. 1-4. S/D structures 110 can be epitaxially grown on fin structures 108. Protection layer 107 can protect gate structure 112* during the etching process prior to the deposition of S/D structures 110. The formation of S/D structures 110 can be followed by replacing polysilicon gate structures 112* with metal gate structure 1120, as shown in FIGS. 1-4. Protection layer 107 can prevent the extrusion of metal gate structure 1120 into S/D structures 110 and fin structures 108 during the formation of metal gate structure 112C. In some embodiments, protection layer 107 can reduce about 75% to about 95% extrusions of gate structure 112C in isolation structure 103.

Various embodiments in the present disclosure provide example methods for forming, protection layer 107 in isolation structure 103 between adjacent finFETs 102A and 102B. The example methods in the present disclosure can form isolation structure 103 on substrate 104 to isolate adjacent finFETs 102A and 102B in abutted active regions 111A and 111B. As shown in FIGS. 1-4, isolation structure 103 can include dielectric structure 105 on substrate 104, gate structure 1120 over dielectric structure 105, and protection layer 107 between dielectric structure 105 and the gate structure 1120. Protection layer 107 can separate gate structure 112C and S/D structures 110 of adjacent finFETs 102A and 102B to prevent the extrusion of gate structure 112C into S/D structures 110 and fin structures 108 due to the over etch during the formation of S/D structures 110. The dimensions of protection layer 107 and dielectric structure 105 can be controlled to minimize parasitic capacitances between gate structure 112C and S/D structures 110.

In some embodiments, a semiconductor device includes a substrate, a transistor with a source/drain (S/D) structure on the substrate, and an isolation structure on the substrate and adjacent to the transistor. The isolation structure includes a dielectric structure on the substrate, a protection layer on the dielectric structure, and a gate structure on the protection layer. The protection layer is disposed between the gate structure and the S/D structure.

In some embodiments, a semiconductor device includes a substrate including a first active region and a second active region, a first transistor on the first active region including a first source/drain (S/D) structure, a second transistor on the second active region including a second S/D structure, and an isolation structure on the substrate and between the first and second transistors. The isolation structures includes a dielectric structure on the substrate, a protection layer on the dielectric structure, and a gate structure on the protection layer. The protection layer is disposed between the gate structure and the first S/D structure and between the gate structure and the second S/D structure.

In some embodiments, a method includes forming a fin structure on a substrate forming a trench in the fin structure, forming a dielectric structure in the trench, removing a portion of the dielectric structure, forming a protection layer on a top surface of the dielectric structure and on sidewall surfaces of the trench, and forming a gate structure on the protection layer. The trench extends into the substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a transistor comprising a source/drain (S/D) structure on the substrate;
   an isolation structure on the substrate and adjacent to the transistor, wherein the isolation structure comprises:

a dielectric structure on the substrate;
a protection layer on the dielectric structure; and
a gate structure on the protection layer, wherein the protection layer is disposed between the gate structure and the S/D structure, and wherein the gate structure is wider than the dielectric structure.

2. The semiconductor device of claim 1, wherein the dielectric structure comprises a first dielectric material and the protection layer comprises a second dielectric material different from the first dielectric material.

3. The semiconductor device of claim 1, wherein the dielectric structure comprises silicon oxide and the protection layer comprises a nitrogen-based dielectric material.

4. The semiconductor device of claim 1, wherein a thickness of the protection layer ranges from about 2 nm to about 10 nm.

5. The semiconductor device of claim 1, wherein the dielectric structure extends into the substrate, and wherein a distance of the dielectric structure extending into the substrate ranges from about 100 nm to about 150 nm.

6. The semiconductor device of claim 1, further comprising an isolation region on the substrate and surrounding the transistor, wherein a distance between a top surface of the isolation region and a top surface of the dielectric structure ranges from about 10 nm to about 30 nm.

7. The semiconductor device of claim 1, further comprising a dielectric layer between the isolation structure and the transistor.

8. A semiconductor device, comprising:
a substrate comprising a first active region and a second active region;
a first transistor, on the first active region, comprising a first source/drain (S/D) structure;
a second transistor, on the second active region, comprising a second S/D structure; and
an isolation structure on the substrate and between the first and second transistors, wherein the isolation structure comprises:
a dielectric structure on the substrate;
a protection layer on a top surface of the dielectric structure and in contact with the first and second active regions; and
a gate structure on the protection layer, wherein the protection layer is disposed between the gate structure and the first S/D structure and between the gate structure and the second S/D structure.

9. The semiconductor device of claim 8, wherein the dielectric structure comprises a first dielectric material and the protection layer comprises a second dielectric material different from the first dielectric material.

10. The semiconductor device of claim 8, wherein the dielectric structure comprises silicon oxide and the protection layer comprises a nitrogen-based dielectric material.

11. The semiconductor device of claim 8, wherein a thickness of the protection layer ranges from about 2 nm to about 10 nm.

12. The semiconductor device of claim 8, wherein the dielectric structure extends into the substrate, and wherein a distance of the dielectric structure extending into the substrate ranges from about 100 nm to about 150 nm.

13. The semiconductor device of claim 8, further comprising an isolation region on the substrate and surrounding the first and second transistors, wherein a distance between a top surface of the isolation region and a top surface of the dielectric structure ranges from about 10 nm to about 30 nm.

14. The semiconductor device of claim 8, further comprising a dielectric layer between the isolation structure and the first transistor and between the isolation structure and the second transistor.

15. The semiconductor device of claim 8, wherein the first active region has a dopant different from the second active region.

16. A semiconductor device, comprising:
a first transistor on a substrate and comprising a first source/drain (S/D) structure;
a second transistor on the substrate and comprising a second S/D structure; and
an isolation structure on the substrate and separating the first transistor from the second transistor, wherein the isolation structure comprises:
a dielectric structure on the substrate, wherein a top surface of the dielectric structure is below the first and second S/D structures;
a protection layer on the dielectric structure; and
a gate structure on the protection layer, wherein the protection layer surrounds the gate structure and separates the gate structure from the first and second S/D structures.

17. The semiconductor device of claim 16, wherein the dielectric structure comprises a first dielectric material and the protection layer comprises a second dielectric material different from the first dielectric material.

18. The semiconductor device of claim 16, wherein the dielectric structure comprises silicon oxide and the protection layer comprises a nitrogen-based dielectric material.

19. The semiconductor device of claim 16, wherein a thickness of the protection layer ranges from about 2 nm to about 10 nm.

20. The semiconductor device of claim 16, further comprising an isolation region on the substrate and surrounding the first and second transistors, wherein a distance between a top surface of the isolation region and a top surface of the dielectric structure ranges from about 10 nm to about 30 nm.

* * * * *